United States Patent [19]

Montagu

[11] 3,970,979
[45] July 20, 1976

[54] LIMITED ROTATION MOTOR WITH VELOCITY SENSING SYSTEM

[75] Inventor: Jean I. Montagu, Brookline, Mass.

[73] Assignee: General Scanning Inc., Watertown, Mass.

[22] Filed: July 2, 1975

[21] Appl. No.: 592,620

[52] U.S. Cl. ................................. 335/229; 310/36; 310/168
[51] Int. Cl.² .......................................... H01F 7/14
[58] Field of Search ............. 335/229, 230; 310/29, 310/36, 39, 168, 15, 25; 350/6; 318/128–132

[56] References Cited
UNITED STATES PATENTS

| | | | |
|---|---|---|---|
| 2,859,391 | 11/1958 | Ericson | 335/229 |
| 3,177,385 | 4/1965 | Montagu | 335/229 X |
| 3,480,809 | 11/1969 | Grib | 318/128 X |
| 3,609,485 | 9/1971 | Dostal | 350/6 |
| 3,624,574 | 11/1971 | Montagu | 350/6 X |

Primary Examiner—Donovan F. Duggan

[57] ABSTRACT

Moving iron limited rotation motors, and recorders employing such motors, in which a velocity sensor structure is axially spaced from a drive structure that is shorter than another drive structure of the drive system. In the preferred embodiment shown, a motor having a pair of diametrically opposite drive structures, the sensor is positioned opposite to the end of the longer drive structure and cooperates with it and a coextensive portion of the rotor in defining flux paths. A pair of permanent magnets extend the full length of the drive-sensor structure, supplying flux to both parts.

9 Claims, 6 Drawing Figures

LIMITED ROTATION MOTOR WITH VELOCITY SENSING SYSTEM

BACKGROUND OF THE INVENTION

This invention relates to limited rotation motors or galvanometers, with particular relevance to motors useful for direct writing recording in which the motor drives a stylus.

There is a need for such recorders, for instance for biological function measurement. The field has developed to the stage that three basic galvanometer-stylus systems are considered by the designer in seeking to find the best balance between the factors of performance, reliability, weight and cost. These are (A) open loop galvanometers with back EMF damping, (B) galvanometers with active velocity feedback, and (C) galvanometers with position and velocity feedback.

With electronic circuitry being compact, inexpensive, and reliable, lightweight battery-operated systems using such circuitry are particularly desired.

PERFORMANCE

Usually it is desired that equipment meet the American Heart Assoication guidelines for frequency response and amplitude which, generally speaking, are: chart span: 50 mmptp (50 millimeters, peak to peak)

frequency response at 10 mmptp:  DC to 50 Hz: ± ½ db
  DC to 100 Hz: − 3 db
square wave response at 10 mmptp: (½ db) overshoot max.

square wave response at 10 mmptp: (1/2 db) overshoot max.

Each field has its own special method of writing and associated prolems: for instance, for cardiac monitoring a stylus with heated tip is used to write over a knife edge; in neurological monitoring an electro encephalograph (EEG) recorder employs z-fold paper and ink writing with a very long stylus to minimize arcuate presentation of the data and a number of recorders must be grouped closely together for efficient usage; fetal monitoring requires heated tip stylii and rectilinear converters to use z-fold paper.

THEORETICAL LIMITATIONS

The minimum torque necessary to meet the required frequency response is obtained from Newton's Law:

$$T = I \frac{d^2\theta}{dt^2}$$

where I is the combined moment of inertia of the rotor and stylus, and $\theta$ is the angular motion. In this case $\theta$ is sinusoidal with a frequency W. Therefore, the maximum torque required is:

$$T = W^2 \theta I$$

This explains why a recorder with 100 Hz response at 10 mmptp will normally have 45 Hz response at 50 mmptp. Both require the same torque.

The torque required to move a stylus-rotor inertia of 20 gr-cm² at 100 Hz over 0.105 radian ptp (equivalent to 10 mmptp) is approximately 400 gr-cm.

The overshoot requirement indicates that the frequency response must be monotonically decreasing. For a spring-mass damped second order system it also defines the minimum resonant frequency at 82 Hz to meet the American Heart Association requirements.

These systems compare with the fundamental limits as follows:

A. Open-loop, with back EMF damping

Very strong coupling is required and only moving-iron galvanometers are now built to operate in this fashion. They perform successfully with rotor stylus inertia below 25 gr-cm². When the inertia increases, however, the damping and gain are sensitive to the temperature (frequency of use, rest position, etc.) of the galvanometer coil and a temperature control can be necessary to avoid D.C. drift. They achieve their frequency response through a high resonant frequency which brings much higher demands on torque and damping than Newton's Law, adding to weight, power and cost. In practice, R. C. network and low pass and high pass filters are also required to improve the frequency response. Such moving iron galvanometers, employing open loop driving, successfully meet the requirements of cardiac monitoring but have not met the requirements for EEG recording where the stylus inertia and motion are large, typically, $I = 45$ gr-cm² and the angle of motion is 7½ degrees. The close grouping of EEG channels requires a very narrow galvanometer which would further limit back EMF damping and render the frequency response less controlled. Furthermore, open loop devices are not well suited for operation demanding uniform frequency response across the entire chart width. As torque and inductance both vary with angular position, the frequency response of the system varies with base line position.

B. Active Velocity Feedback

In general the motor-stylus assembly comprises a second order system (a second order system exists when there are two energy accumulation parts, such as a spring, here the return spring, and a mass, here the rotor and stylus, between which there is energy exchange). The frequency response of such a system changes from a flat response up to resonance to an abruptly greater response at resonance. If however the second order system is heavily damped (i.e. with a damping ratio of 5) by feedback of a velocity signal, the frequency response would gradually decrease with increase of frequency, similar to that of a first order system. Then if a first order lead network is included at the input, a system can theoretically be obtained with flat frequency response capabilities extending beyond the natural resonant frequency of the mechanical system with good stability and ease of control. In theory such system would have frequency and phase responses so superior to the second order system without these special provisions that it would be possible to meet American Heart Association performance criteria with only the torque constraint of Newton's Law. Thus the natural resonant frequency could be reduced even below the required operating range, with lessened power requirements because of reduction of torque.

There is a serious difficulty, however, in generating a velocity signal sufficiently free of coupling with the drive current. These coupling effects increase with the second power of frequency and become especially detrimental beyond resonance when induced drive currents change phase relative to the velocity current. For these and other reasons the full capabilities of the velocity feedback method have not been realized.

Moving coil galvanometers (which cannot be built with a torque-to-inertia ratio comparble to those of moving iron devices) have traditionally been constructed with an auxiliary velocity pick-off winding on the drive coil for attempted use in damping, but with problems of heating, expense, etc.

Conventional moving iron galvanometers would be even less successful in this mode of operation. The mutual inductance of an auxiliary winding on the drive coil, in the presence of the magnetic core of such galvanometer, is enormous, just as it is in a transformer. To install a velocity pick-off on the galvanometer sufficiently remote to be free of coupling would result in increased weight, loss of rigidity and other disadvantages, sufficient to deter their use.

C. Position and Velocity Feedback

This type of galvanometer seeks to separate the three functions of a second order system so that they can be controlled independently, incorporating a torque generating section, a position detector and a tachometer. Sometimes the velocity signal, used for damping and stability, is derived from the position signal.

It is necessary that all signals be added in adequate proportion and proper phase relationship. Corrections have to be made for each detector and processor idiosyncrasy. Such systems have had all the problems of velocity feedback systems mentioned above plus other problems. The major difficulty is stability. Damping has to be introduced to prevent the system from destroying itself. Stylus motions and internal vibrations are detected via the position pick-off, amplified, and tend to make the system whistle at various conditions. If uncontrolled, this is not only disturbing to the user, but will cause failure by fatigue of the stylus or other parts. This is variously dealt with by keeping the conventional spring return and using a very rugged and heavy stylus, or by having a self-damped stylus, or an additional velocity detector. Commonly, in addition to the stability problems, or to overcome them, such recorders require considerable power and are expensive.

The system cost and performance of a recorder with active velocity feedback would be better than an equivalent device with back EMF damping or a device employing position and velocity feedback if a moving iron construction effectively employing such feedback were available. This is especially true for battery-operated recorders in view of the cost and weight required for power.

SUMMARY OF INVENTION

Objects of the invention therefore are to provide an improved moving iron limited rotation motor incorporating a velocity sensor capable of providing a signal useful for velocity feedback damping; to provide a recording system incorporating such motor; to achieve the above in a relatively light weight, compact and inexpensive construction having a high degree of performance and reliability; and specifically to provide an improved motor and recorder suitable for EEG recording with many closely grouped, narrow channels, using paper to minimize cost and using a long ink pen to provide a near-rectilinear presentation.

One aspect of the invention concerns a limited rotation motor comprising a rotor which is elongated in the direction of its axis of rotation and has faces for interaction with stator faces, magnet means extending lengthwise of the rotor and adapted to produce bias flux, stator means extending lengthwise of the rotor constructed to conduct the bias flux between stator faces, thereby to complete with the rotor a magnetic circuit for the bias flux, and a drive system comprising a plurality of drive structures extending lengthwise of the rotor, each comprising a drive coil for producing drive flux and a stator constructed to conduct the drive flux between stator faces thereby to complete with the rotor magnetic circuits for the drive flux, the rotor adapted to be driven by interaction of the drive and bias fluxes. According to the invention one of the drive structures is shorter in axial dimension than another and a velocity sensor structure is disposed on the same side of the rotor as the shorter drive structure and spaced axially therefrom, the sensor structure comprising a discrete sensor stator associated with a sensing coil and constructed to conduct flux from a magnet means between sensor stator faces, thereby to complete with the rotor a magnetic circuit for the flux, and the sensor coil disposed to receive an induced current in response to modulation of flux in the latter magnetic circuit caused by movement of the rotor, whereby the sensor structure can be compactly arranged with the drive system and produce useful velocity information. In preferred embodiments there is axial overlap between the sensor structure and the other drive structure, the structures occupying different circumferential positions relative to the axis, preferably the motor consisting of two diametrically opposite drive structures, the outer end of the sensor structure and the opposite drive structure corresponding in axial position; the rotor is comprised of ferromagnetic substance in the region between the shorter drive structure and the sensor structure thereby serving as an alternate path for stray drive flux, and limiting the effect of such stray flux on the sensor coil; a permanent magnet extends throughout the driven length of the rotor, serving to produce the bias flux and flux for operation of the sensor; and the stators for the drive structure and the sensor structure are all comprised of stacks of identical ferromagnetic laminations, the laminations defining also the stator means for conducting bias flux.

According to another feature, motor-sensor systems such as described above are combined with circuitry for modifying the frequency response, the circuitry comprising a damping circuit responsive to the output of the velocity sensor to produce behavior of the electro-mechanical system comprising the motor and a predetermined load to approximate that of a first order system and a lead in network is adapted to modify input signals according to substantially the opposite behavior of the approximated first order system. Preferably the load is an elongated recording stylus and the damping circuit is adapted to provide a damping ratio of between about 3 and 10, preferably around 5; and, preferably, with independence of the constants of the drive and sensor structures, a selected proportion of drive current and drive coil voltage is fed back to correct the sensor signal.

According to still another feature an EEG recorder is provided with a closely related group of motors as described, each driving an elongated stylus.

These and other objects, features and advantages of the invention will be understood from the following description of a preferred embodiment taken in conjunction with the drawings wherein.

Figure 1:
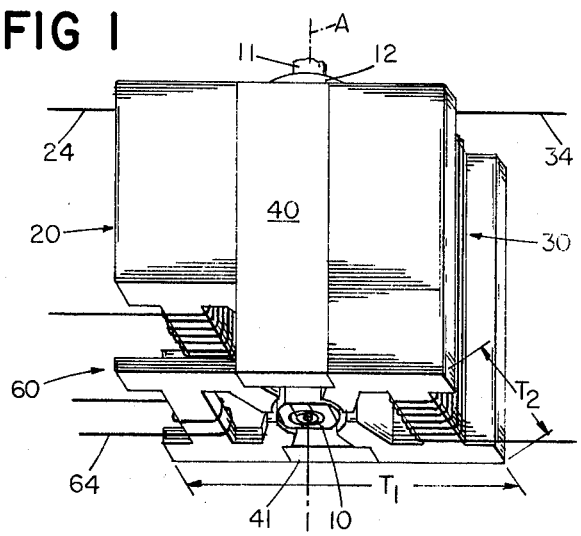
FIG. 1 is a perspective view of a limited rotation motor according to a preferred embodiment of the invention.
Figure 2:
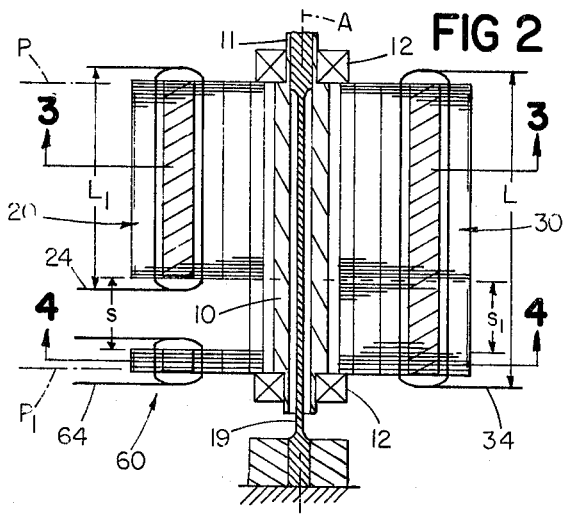
FIG. 2 is a vertical cross-section of the motor of FIG. 1.
Figure 3:
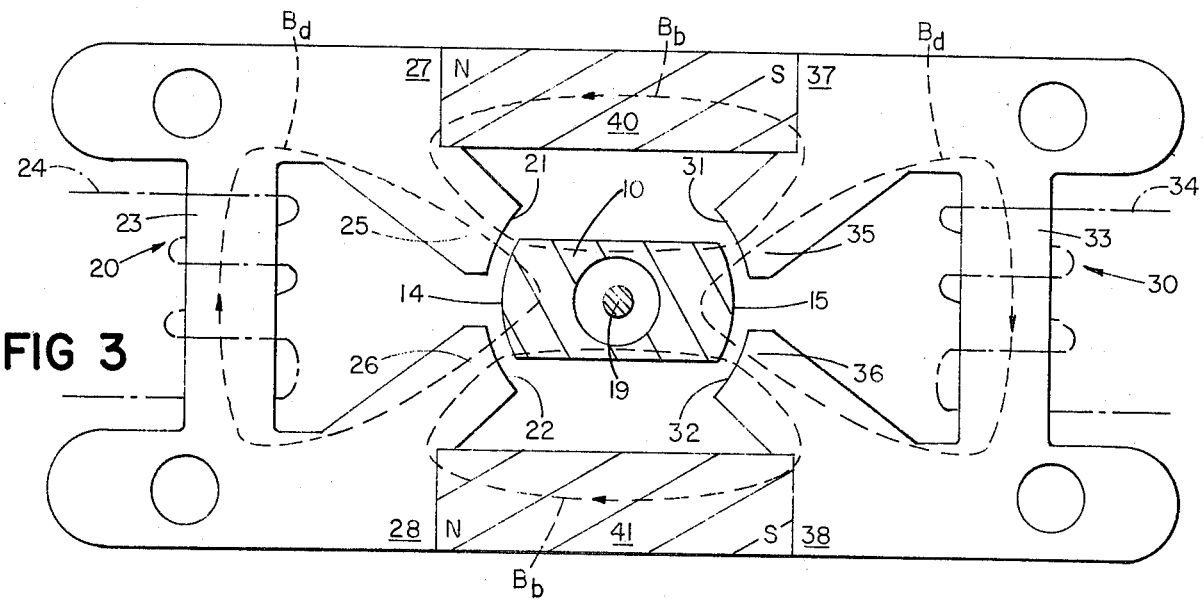
Figure 4:
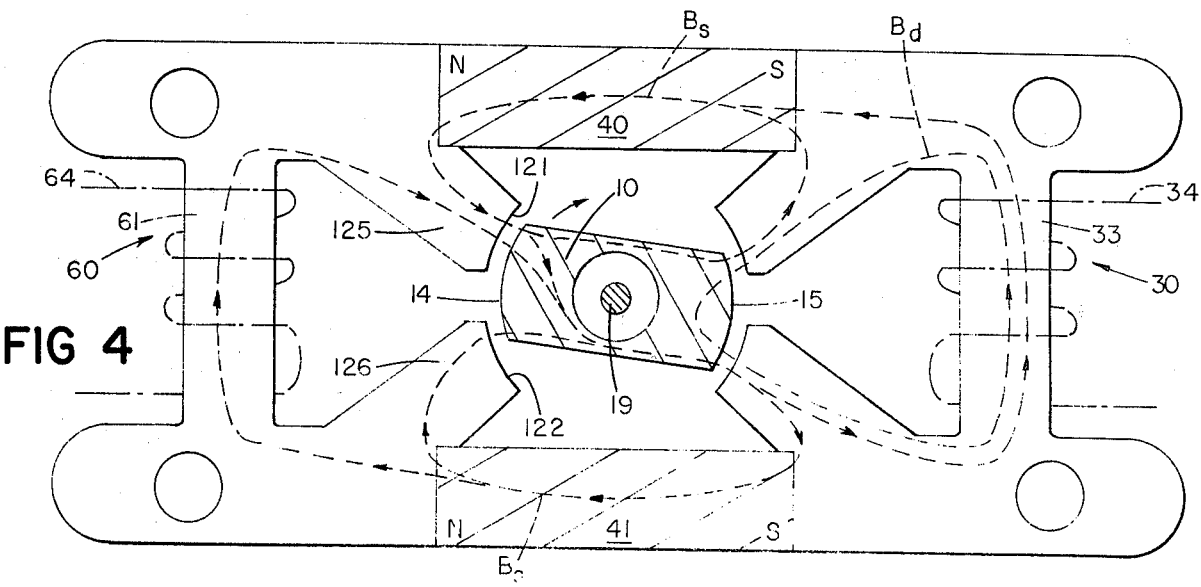
Figure 5:
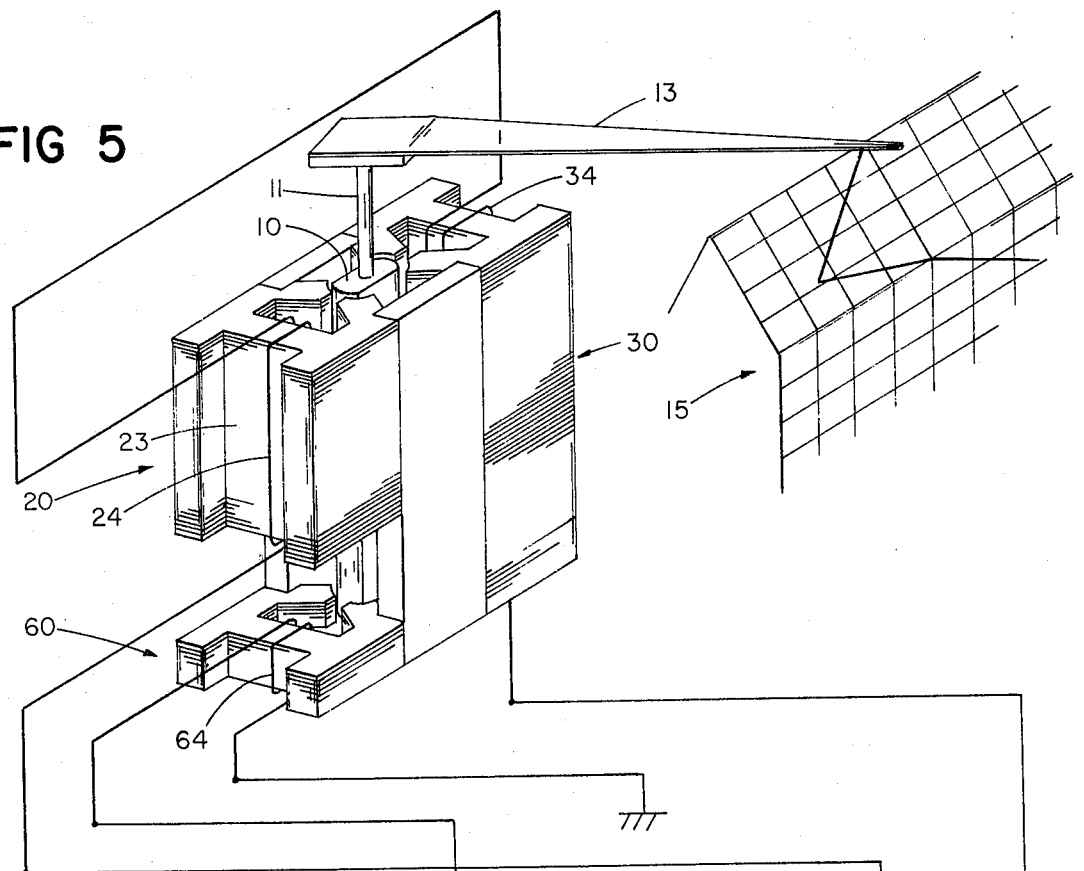
Figure 6:
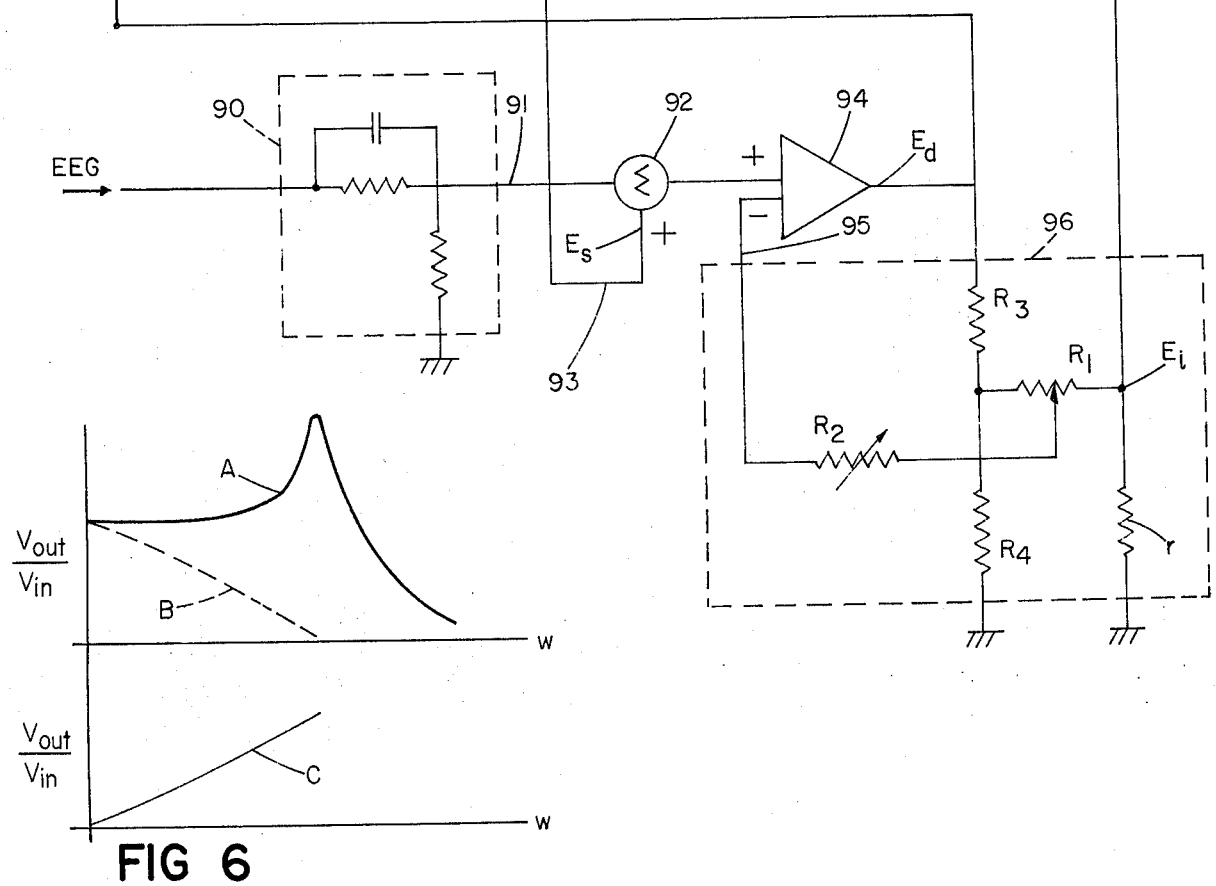

FIGS. 3 and 4 are horizontal cross-sections taken on lines 3—3 and 4—4 of FIG. 2;

FIG. 5 is a perspective view of a recorder incorporating the motor of FIG. 1, and includes a diagram of the circuitry;

FIG. 6 is a set of performance curves for the embodiment of FIG. 5.

The preferred embodiment here to be described employs moving iron rotors which rotate at right angles to the flux paths from the stators. For information concerning the general construction of such motors, reference is made to applicant's prior U.S. pat. Nos. 3,177,385 and 3,624,574, which are incorporated herein by reference. According to certain aspects of the invention other configurations are of course possible as where the rotor moves parallel to the lines of flux or where the coils and other magnetic components have other arrangements.

Referring now to FIGS. 1–4, the preferred embodiment comprises an elongated ferromagnetic rotor 10 mounted in bearings 12 to rotate about its longitudinal axis A through a limited arc. Oppositely directed cylindrical poles faces 14, 15 of the rotor interact with cylindrical stator pole face pairs 21, 22 and 31, 32 of respective stator structures 20 and 30. Each of these structures comrises a stack of identical ferromagnetic laminations bolted together, each defining an elongated core portion 23, 33 about which is would a respective drive coil 24, 34, pairs of flux arms 25, 26 and 35, 36 completing magnetic circuits $B_d$ for drive flux from the respective cores through the rotor via the respective pole faces, and flux carrying portions 27, 28 and 37, 38 completing, with the mentioned flux arms, magnetic circuits $B_d$ for bias flux from permanent magnets 40 and 41.

Drive stator 30 and its associated coil extend the full length L of the rotor and apply drive flux thereto; but drive stator 20 and its associated coil are shorter, extending distance $L_1$, in this embodiment ⅔ length L, having one end lying in the same plane P as an end of the other stator, and applying drive flux over only that length of the rotor. As shown in FIG. 5 the drive coils 24 and 34 are connected in series to drive circuitry to receive the same drive current.

A sensor formed by sensor stator 60 and sensor coil 64 is located on the same side of the rotor as the shorter drive structure formed by stator 20 and coil 24, stator 60 being formed of a short stack of laminations identical with the laminations of stator 20 and stator 60 is spaced distance S from stator 20 and has its outer end aligned with the corresponding end of stator 30 of the longer drive structure, at plane $P_1$. The sensor stator thus forms with the permanent magnets 40, 41 and with the end portion of stator 33, a magnetic path for flux $B_s$.

In operation, a drive current of varying value is applied in series to drive coils 24, 34. Flux $B_d$ generated by this current interacts with the flux produced by the permanent magnets 40, 41 to produce a drive torque, and as the rotor moves, the permanent magnet flux passing through the sensor stator is modulated in a way related to the velocity of movement, inducing a related current in the sensor coil 62.

The details of the magnetic interaction of this embodiment are complex. In the region of coextension of the two drive structures, especially over the first half of the length of the motor from plane P, the motor is basically of symmetrical construction, the respective coils produce drive flux of equal density and distribution in the laminations of the stators 20 and 30, as do the permanent magnets with respect to bias flux, and drive torque is produced in the manner common to such motors. See flux diagram, FIG. 3.

In the region of discontinuity represented by space S the effects are different. The bias flux passes through laminations of the extended portion $S_1$ of the longer drive structure and across the stator and rotor faces. The magnetic path is completed for this bias flux by paths extending lengthwise in the rotor to adjacent portions of the stators 20 and 60 of the shorter drive structure and the sensor respectively.

The bias flux thus can suffer some variation in density in section $S_1$ relative to that in the first half of the motor, but is still available at appreciable levels and in the right direction to interact with drive flux produced in the $S_1$ portion of the drive structure.

In the region of overlap of the sensor stator 60 and the longer drive stator the circumstances are still different. Here the permanent magnet flux $B_s$ is exposed to identical ferromagnetic laminations at opposite sides of the rotor, but the flux serves different purposes on the two sides. At the longer drive structure it serves as biasing flux, for interaction with the drive flux from drive coil 34 to produce torque upon the rotor. At the sensor it serves as generator flux, its modulation producing a current in the sensor coil 64 related to velocity of the rotor in the following way. At rest, in null position, the permanent magnet flux distribution in stator 60 is the same as shown for stator 20 in FIG. 3. But when rotation occurs the distribution changes. Referring to FIG. 4, laminations of sensor stator 60 have extremely high magnetic permeability so that poles 121 and 122 must have the same magnetic flux density. As the rotor 10 changes position the total flux passing through sections 125 and 126, respectively, readjusts accordingly by flux passing through core section 61 disposed within sensor coil 64. These changes are sensed by coil 64 which generates a potential (voltage) proportional to the angular velocity of rotor 10.

In this embodiment still other effects and considerations are present.

The extended portion of the longer drive structure provides for a motor of given length a greater effective length of drive structure than otherwise would be present. In this respect the level of drive current required is relatedly reduced, reducing the level of coupling of the drive current in the sensor coil 64, hence enhancing the effect of velocity on the total current in the sensor coil and reducing the degree of correction required for drive current coupling.

Of somewhat similar effect is the portion of the ferromagnetic rotor 10 and the portion of the longer drive structure that span space S. These offer an alternate path to certain portions of the stray drive flux from the shorter drive structure, again reducing the coupling effects in the sensor coil.

In summarizing, despite complexities and non-uniformities, the preferred embodiment achieves an effective combination motor and velocity sensor.

In motor constructions following this embodiment there will however be a drive component in the current flowing in the sensor coil, the amount depending upon the particular dimensions chosen for the respective parts. The effect of this component is minimized by the electronic circuitry shown in the recorder illustrated in FIG. 5.

Referring to FIG. 5 the input of the recorder, e.g. the output of an electroencephalograph, is applied to a first order lead in network 90 in the form of a high pass filter, and its output 91 is applied to summing junction 92 to which also is applied the output 93 of sensor coil 64 at voltage $E_s$. The combined signal is applied to amplifier 94 to which also is applied a correction signal 95 for cancelling the effects of the coupled drive current component in sensor output 93. The output of amplifier 94 is then fed in series through the drive coils 24 and 34, thence to ground through resistor $r$. The correction signal for the amplifier comprises selected functions of both the drive current and the drive voltage obtained by correction network 96. The drive current $i$ appears above ground resistor $r$ in the drive coil circuit, at voltage $E_i$, and the voltage $E_d$ of the drive coil appears at the output of the amplifier.

By this circuitry the pick off signal from sensor coil 64 and a proper ratio of current and voltage from the drive coil are fed back to the amplifier. The ratio is determined from the following considerations. The pick off signal is the sum of two induced voltages one proportional to the velocity of motion of the rotor, and the other proportional to the derivative of the drive current.

$$E_s = A \frac{d\theta}{dt} + B \frac{di}{dt} \quad (1)$$

where $d\theta/dt$ is the rotor velocity and $di/dt$ is the derivative of the drive current and A and B are circuit constants. The voltage at the drive coil is also a combination of signal:

$$E_d = Ri + C \frac{d\theta}{dt} + D \frac{di}{dt} \quad (2)$$

where $R$ is the sum of all resistances and $C$ and $D$ are circuit constants.

The third available signal is the current feedback signal:

$$E_i = ri \quad (3)$$

Thus with the voltages $E_i$, $E_d$ and $E_s$ being measurable, there are three equations and three unknowns, $d\theta/dt$, $di/dt$ and $i$ for which an exact solution exists *if the three equations are truly independent*. One can see readily that equations 1 and 2 are independent: B is the mutual inductance of the drive coils 24 and 34 with the pick off or sensor coil 64 and the coupling constant can be changed at will by adjusting distance and materials in between the coils.

$$A = B_s L_s N_s d$$

where $B_s$ is the magnetic field at the sensor gap, $L_s$ is the axial length of the sensor, $N_s$ is the number of its turns, and $d$ is the diameter of the rotor.

The values of the constants of the 2d equation are not related to those of equation 1.

$$R = R + r$$

where:
$R$ is the resistance of the drive coils,
$r$ is the current feedback measurement resistance, $$C = B_d L_d N_d d$$

where $B_d$ is the magnetic field at the drive gaps, $L_d$ is the equivalent length of the entire drive system, $N_d$ is the equivalent number of turns, and $L_d$ and $N_d$ are independent of the corresponding values of the sensor.

D is the self linductance of the drive coils. It is mostly a function of the second power of the number of turns of the coils and geometry of the magnetic circuit.

The emphasis upon the independence of the constants is important because if the constants A, B and C, D are derivable from each other, as would be the case if one attempted to do the same work with a symmetrical two coil rotor, driving with one coil and using the 2d one as pick off, the set of equations would no longer be independent and no solution would be available.

The same difficulty would exist if the pick off is of symmetrical construction with the drive section of the motor.

The prefered embodiment meets the requirement for independence.

Solving for di/dt from eq. 1 and 2

$$\frac{di}{dt} = \frac{E_s}{B} - \frac{A}{B} \frac{d\theta}{dt}$$

$$\frac{di}{dt} = \frac{E_d}{D} - \frac{R i}{D} - \frac{C}{D} \frac{d\theta}{dt}$$

and by substraction $$0 = \frac{E_s}{B} - \frac{E_d}{D} + \frac{R i}{D} + \frac{d\theta}{dt} \left[ \frac{C}{D} - \frac{A}{B} \right]$$

which simplifies to $$\frac{d\theta}{dt} = \frac{D}{AD-CB} [E_s - \frac{B}{D} E_d + \frac{RB}{rD} E_i]$$

From the above considerations it is evident that the three voltages can be summed in the right proportion to yield a signal proportional to the angular velocity of the rotor and that it can be used to control the damping of the system.

The combined process of adding, subtracting and proportional adjustment is achieved in FIG. 5 through the selection of the values of resistors $R_1$, $R_2$, $R_3$ and $R_4$.

Referring still to FIG. 5 it is seen tht rotor 10 is rigidly connected by shaft 11 to elongated recording metal edge-writing stylus 13 which is positioned relative to a paper transport 15 to write in accordance with input signals to the motor.

The mass of the rotor and stylus combination and the return spring 19 (FIG. 2) of the stylus result in a second order system whose frequency response with light damping is described by curve A of FIG. 6. By use of the circuitry shown in FIG. 5, heavy damping (e.g. damping ratio of 5) is applied to the motor using the sensed velocity of the rotor, resulting in the performance curve B for the electro mechanical system. The performance curve C of the lead in network 90 is added to curve B, thus producing a flat response for the system extending to and beyond the natural resonant frequency of the bare mechanical system.

Referring to FIGS. 1 and 2, in a typical motor the laminations are of 0.014 inch thickness, 14 of which are employed to form the sensor stator. The spacing S is 0.35 inch and the length of the longer drive stator ranges between 1 and 2 inches. The windings on the sensor stator are typically 400 turns of No. 36 wire while the windings on the drive stators are 400 turns of No. 29 wire. The transverse outside dimensions of the motor are typically $T_1 = 1\frac{3}{4}$ inch, $T_2 = \frac{3}{4}$ inch.

Numerous other embodiments are within the spirit and scope of the claims.

I claim:

1. In a limited rotation motor comprising:
   a rotor which is elongated in the direction of its axis of rotation and has faces for interaction with stator faces,
   magnet means extending lengthwise of the rotor and adapted to produce bias flux,
   stator means extending lengthwise of the rotor constructed to conduct said bias flux between stator faces, thereby to complete with said rotor a magnetic circuit for said bias flux,
   a drive system comprising a plurality of drive structures extending lengthwise of the rotor, each comprising a drive coil for producing drive flux and a stator constructed to conduct said drive flux between stator faces thereby to complete with said rotor magnetic circuits for said drive flux,
   the rotor adapted to be driven by interaction of said drive and bias fluxes;
   the improvement wherein:
   one of said drive structures is shorter in axial dimension than another and
   a velocity sensor structure is disposed on the same side of the rotor as said shorter drive structure and spaced axially therefrom,
   said sensor structure comprising a discrete sensor stator associated with a sensing coil and constructed to conduct flux from a magnet means between sensor stator faces, thereby to complete with said rotor a magnetic circuit for said flux,
   and said sensor coil disposed to receive an induced current in response to modulation of flux in the latter magnetic circuit caused by movement of said rotor,
   whereby said sensor structure can be compactly arranged with said drive system and produce useful velocity information.

2. The limited rotation motor according to claim 1 wherein there is axial overlap between said sensor structure and said other drive structure, said structures occupying different circumferential positions relative to said axis and cooperating to form a flux path from a permanent magnet, said flux serving as generator flux for said sensor and bias flux for said drive structure.

3. The limited rotation motor according to claim 2 wherein said permanent magnet is stationary and extends over the length of the motor, providing bias flux for each drive structure.

4. The limited rotation motor according to claim 1 wherein said rotor is comprised of ferromagnetic substance in the region between said shorter drive structure and said sensor structure thereby serving as an alternate path for stray drive flux, and limiting the effect of such stray flux on said sensor coil.

5. The limited rotation motor according to claim 1 wherein stators for said drive structure and said sensor structure are all comprised of stacks of identical ferromagnetic laminations, said laminations defining also the stator means for conducting bias flux.

6. The moving iron motor of claim 1 in combination with spring means forming a second order mechanical system and circuitry for extending its frequency response, said circuitry comprising a damping circuit responsive to the output of said velocity sensor to produce behavior of the electro mechanical system comprising the motor and a predetermined load to approximate that of a first order system and a lead in network adapted to modify input signals according to substantially the opposite behavior of said approximated first order system.

7. The moving iron motor of claim 6 wherein said load is an elongated recording stylus and said damping circuit is adapted to provide a damping ratio of between about 3 and 10.

8. The moving iron motor of claim 6 including correction means to correct the signal of said sensor to reduce the effects of coupled drive current.

9. In a moving-iron limited rotation motor comprising a ferromagnetic rotor of predetermined length having faces for interaction with stator faces,
   a pair of elongated stationary magnets extending along the length of the rotor adapted to produce bias flux,
   a pair of drive stator structures, each associated with a respective drive coil for producing drive flux, each stator structure constructed to conduct said bias flux relative to said rotor through cooperating rotor and stator pole faces, thereby to complete with said rotor magnetic circuits for said bias flux,
   and each stator structure constructed to conduct said drive flux relative to said rotor through cooperating rotor and stator pole faces, thereby to complete with said rotor magnetic circuits for said drive flux,
   the rotor adapted to be driven by interaction of said drive and bias fluxes,
   the improvement wherein a velocity sensor is provided integral with said rotor,
   one of said drive stator structures being substantially longer than the other,
   a discrete sensor stator structure disposed on the same side of the rotor as the shorter of said drive stator structures, spaced from said shorter drive structure and opposed to a portion of said rotor, said magnet and said longer drive stator structure,
   said sensor stator structure associated with a sensing coil and constructed to conduct flux from said magnets relative to said rotor through cooperating rotor and stator pole faces, thereby to complete with said rotor a magnetic circuit for said flux,
   and said sensor coil disposed to receive an induced current in response to modulation of flux in the latter said magnetic circuit caused by movement of said rotor,
   said sensor thereby compactly sharing said rotor and magnets with the drive structure while enabling its magnetic parameters to be distinguished from those of the drive structure.

* * * * *